US012805368B2

(12) United States Patent
Shan et al.

(10) Patent No.: US 12,805,368 B2

(45) Date of Patent: Nov. 17, 2026

(54) METHODS AND APPARATUS FOR OPTICAL THERMAL TREATMENT IN SEMICONDUCTOR PACKAGES

(71) Applicant: Intel Corporation, Santa Clara, CA (US)

(72) Inventors: Bohan Shan, Chandler, AZ (US); Hongxia Feng, Chandler, AZ (US); Haobo Chen, Chandler, AZ (US); Srinivas Pietambaram, Chandler, AZ (US); Bai Nie, Chandler, AZ (US); Gang Duan, Chandler, AZ (US); Kyle Arrington, Gilbert, AZ (US); Ziyin Lin, Chandler, AZ (US); Yiqun Bai, Chandler, AZ (US); Xiaoying Guo, Chandler, AZ (US); Dingying Xu, Chandler, AZ (US); Sairam Agraharam, Chandler, AZ (US); Ashay Dani, Chandler, AZ (US); Eric J. M. Moret, Beaverton, OR (US); Tarek Ibrahim, Mesa, AZ (US)

(73) Assignee: Intel Foundry IP LLC, Santa Clara, CA (US)

( * ) Notice: Subject to any disclaimer, the term of this patent is extended or adjusted under 35 U.S.C. 154(b) by 81 days.

(21) Appl. No.: 18/147,497

(22) Filed: Dec. 28, 2022

(65) Prior Publication Data

US 2024/0222301 A1 Jul. 4, 2024

(51) Int. Cl.

*H10W 72/00* (2026.01)
*H10W 72/20* (2026.01)
*H10W 74/40* (2026.01)

(52) U.S. Cl.

CPC .... *H10W 72/012* (2026.01); *H10W 72/01208* (2026.01); *H10W 72/281* (2026.01); *H10W 74/40* (2026.01)

(58) Field of Classification Search

CPC ......... H10W 42/20–284; H10W 40/10; H10W 70/618; H10P 95/90–906

See application file for complete search history.

(56) References Cited

U.S. PATENT DOCUMENTS

2021/0343911 A1* 11/2021 Watanabe ............ H10H 20/855
2025/0022991 A1* 1/2025 Chen .................... H10H 20/852

FOREIGN PATENT DOCUMENTS

WO WO-2024068295 A1 * 4/2024 .......... H10W 70/618

* cited by examiner

*Primary Examiner* — Evan G Clinton

(74) *Attorney, Agent, or Firm* — Hanley, Flight & Zimmerman, LLC

(57) ABSTRACT

Methods and apparatus for optical thermal treatment in semiconductor packages are disclosed. A disclosed example integrated circuit (IC) package includes a dielectric substrate, an interconnect associated with the dielectric substrate, and light absorption material proximate or surrounding the interconnect, the light absorption material to increase in temperature in response to being exposed to a pulsed light for thermal treatment corresponding to the IC package.

19 Claims, 9 Drawing Sheets

METHODS AND APPARATUS FOR OPTICAL THERMAL TREATMENT IN SEMICONDUCTOR PACKAGES

FIELD OF THE DISCLOSURE

This disclosure relates generally to semiconductor packages and, more particularly, to methods and apparatus for optical thermal treatment in semiconductor packages.

BACKGROUND

Integrated circuit (IC) substrate and/or package manufacturing can involve multiple thermally based process steps, including copper annealing, material cure and solder reflow, all of which can result in package stress due to relatively high temperatures. In particular, these processes typically necessitate significant heating of an entire package and/or device which can, in turn, cause different components thereof to expand at different rates, thereby resulting in stresses within the semiconductor package.

Figure 1A:
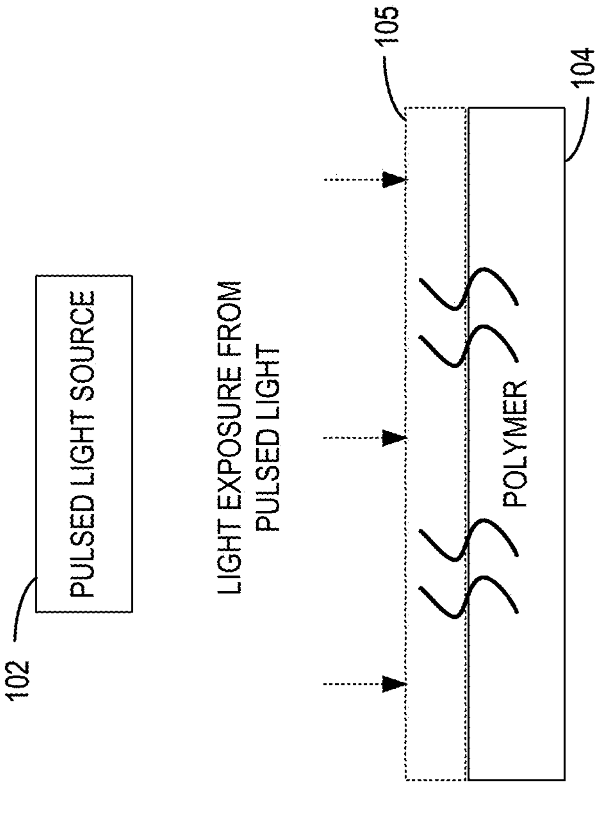
FIGS. 1A and 1B are cross-sectional views that depict an example process in accordance with teachings of this disclosure.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real world delays for computing time, transmission, etc. Thus, unless otherwise specified, "substantially real time" refers to real time +/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

DETAILED DESCRIPTION

Methods and apparatus for optical thermal treatment in semiconductor packages are disclosed. Integrated circuit (IC) substrate and/or package manufacturing can involve multiple thermally-based process steps, such as copper annealing, material cure and solder reflow, all of which can result in package stress due to relatively high temperatures. In particular, these processes typically require heating of an entire package and/or device which can, in turn, cause different components thereof to expand at different rates, thereby resulting in stresses within the semiconductor package.

Examples disclosed herein enable relatively low temperature thermal processing that is optically based. In particular, examples disclosed enable highly localized heating of a portion of a semiconductor device/package while enabling other portions to remain at relatively low temperatures. The localized heating occurs by applying a pulsed light to a light absorption material, which can be a dielectric material. In turn, the light absorption material rapidly increases in temperature, thereby causing surrounding and/or proximate components/structures to heat up substantially. In some examples, the resultant heat increase is utilized to melt a solder joint (e.g., a reflowable solder joint) in a solder reflow process or fuse a joint (e.g., a surface interface joint for an optocoupler). Additionally or alternatively, the resultant heat increase is utilized to increase a temperature of an interconnect pad (e.g., a copper pad).

In some examples, the light passes through an at least partially transparent portion (e.g., a layer, a wall etc.) before reaching the aforementioned light absorption material. In some examples, the light absorption material is positioned between first and second dielectrics (e.g., first and second dielectric layers.). Additionally or alternatively, the light absorption material includes a visible light absorbing material. In some such examples, light absorption material is at least partially composed of polyimide. In some examples, the light absorption material is utilized to define an optical coupler interface.

In some examples, the light absorption material is placed at or proximate thermally sensitive structures and/or components that are not heated up significantly when the pulsed light is applied to the light absorption material. According to examples disclosed herein, the pulsed light can be focused on specific portions of the light absorption material.

As used herein, the term "light absorption material" refers to a material, substance, layer and/or application that experiences a significant rise in heat (and temperature) when provided with and/or exposed to pulsed light such that the material, substance, layer and/or application has a light absorbing capability and transmissivity characteristics where exposure to a pulsed light causes a rise in temperature of at least 100° Celsius (C) in less than 1 second. As used herein, the term "pulsed light" refers to light that is pulsed with constant or varying duration periods and/or duty cycles. As used herein, the term "interconnect" applies to any routing, trace, via, pad, solder joint, etc. utilized to define an electrical contact in a semiconductor device and/or package.

Figure 1B:
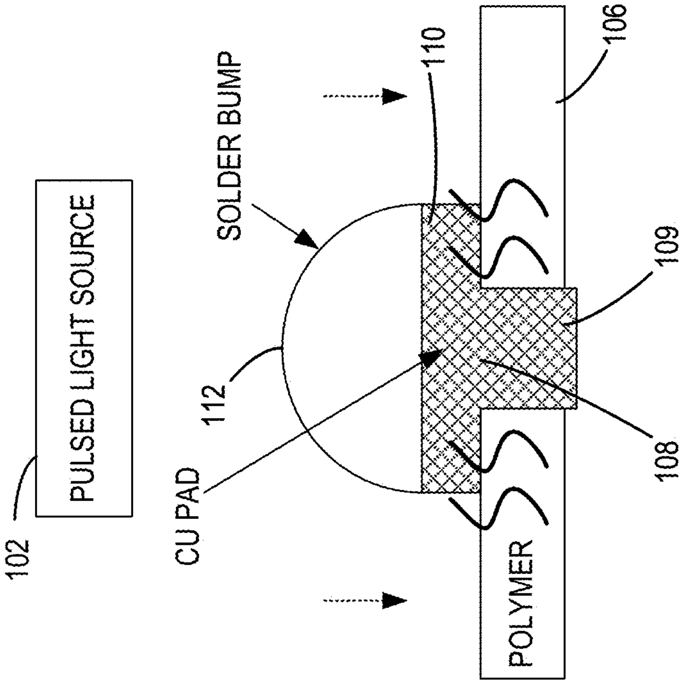

FIGS. 1A and 1B are cross-sectional views that depict an example process in accordance with teachings of this disclosure. Turning to FIG. 1A, a pulsed light source 102 is shown providing a pulsed light to a light absorption material 104, which is structured as a layer (e.g., a substrate layer) at least partially composed of a polymer, such as a polyimide material, for example. However, the light absorption material 104 can be any other appropriate material including, but not limited to, epoxies, epoxy material, solder material, etc.

As a result of being exposed to the pulsed light, the light absorption material 104 experiences a relatively rapid and significant increase in temperature and heat. This relatively rapid increase in temperature and heat can be utilized in thermal processing (e.g., annealing, material cure and solder reflow, etc.) associated with a corresponding semiconductor package, component and/or device. In some examples, the pulsed light source 102 is to provide the pulsed light through an at least partially transparent (e.g., fully transparent) substrate (e.g., a dielectric substrate, a layer, a component, etc.) 105. In other words, the light absorption material 104 can be utilized for heating even when placed in and/or covered by another structure/layer, which can be at least partially transparent. In this example, the pulsed light can be a broadband light that is pulsed at intervals of approximately 1-100 hertz (Hz) and can have a pulse duration of 1 microseconds (μs) to 10 seconds. However, any appropriate duration, frequency and/or duty cycle can be implemented, instead. Further, the temperature of the light absorption material 104 can reach around 300° C. to 350° C., for example.

According to examples disclosed herein, the light absorption material 104 can be colored for a relatively large temperature increase when being exposed to a broadband spectrum light (e.g., a visible light). As will be discussed in greater detail below in connection with FIGS. 2 and 3, examples disclosed herein can be implemented in conjunction with Embedded Multi-Die Interconnect Bridge (EMIB) technology, for example.

According to examples disclosed herein, the light absorption material 104 can be a layer, a film, an applique, a component, a substrate, a placed/assembled component, a spray-on layer, an applied layer, a surface layer, etc. Generally, the light absorption material 104 can be any appropriate structure and/or application that responds to pulsed light. In this example, the light absorption material 104 can experience a temperature greater than 300° C. in less than 10 seconds when exposed to the pulsed light. In some examples, the light absorption material 104 is at least partially composed of polyimide and only covers and/or spans a portion of a respective semiconductor device/package so that any heat generated by exposure to pulsed light is generally localized to that portion, thereby enabling other portions of the semiconductor device/package to remain relatively cool when the pulsed light is applied to the portion. As a result, the other portions not adjacent or proximate the light absorption material 104 can avoid any damage related to excessive heat (e.g., warpage, unintended solder reflow, etc.), thereby enabling increased reliability thereof. To that end, in some examples, the pulsed light source 102 can be directed, aimed and/or oriented to specific portions of the light absorption material 104 (e.g., via an actuator or other movement device). In this example, the light absorption material 104 is provided with pulsed light to cure a structure and/or portion of a semiconductor device and/or package.

According to examples disclosed herein, the light absorption material 104 material is able to absorb light energy, which is implemented as broadband light consisting of many different wavelengths, for example. Accordingly, the light absorption material 104 material absorbs the light and heats up significantly in a relatively short time before material adjacent to it is warmed up as well (e.g., relatively low transmittance). Subsequent to light-based cure/reflow, the light absorption material 104 material has comparable performance (e.g., mechanical, chemical, or electrical) to typically used thermal cure/reflow materials. In this example, the light absorption material 104 has sufficient robustness or adhesion to adjacent structures, so that the light absorption material 104 is resistant to crack or delamination with a short duration high temperature heating.

The light absorption material 104 of the illustrated example can have light absorbing components embedded within. In particular, the light absorbing component can be an independent component or part of the major material polymer chains or composition.

FIG. 1B depicts a solder reflow process in accordance with teachings of this disclosure. In the illustrated example of FIG. 1B, a light absorption material 106 includes an interconnect pad 108, which is at least partially composed of copper, extending therethrough. In turn, the example interconnect pad 108 includes a narrow portion 109 and a wide portion 110. Further, a solder bump 112 is positioned over the interconnect pad 108 (in the view of FIG. 1B).

To reflow the solder bump 112, the pulsed light source provides pulsed light to the light absorption material 106, which is a polymer (e.g., an opaque polymer), thereby causing the light absorption material 106 to heat up significantly. As a result, the interconnect pad 108 is provided with sufficient heat to melt and/or reflow the solder bump 112. In the illustrated example, the temperature and heat generated by exposing the light absorption material 106 is significantly less than known thermal treatment processes that heat entire packages and/or structures.

In some examples, the solder 112 is and/or is composed of light absorption material. In some such examples, the solder 112 responds to the pulsed light with a rapid increase in temperature. As a result, the solder 112 is caused to at least partially reflow based on received pulsed light (e.g., in addition to heat generated in the light absorption material 106).

Figure 2:
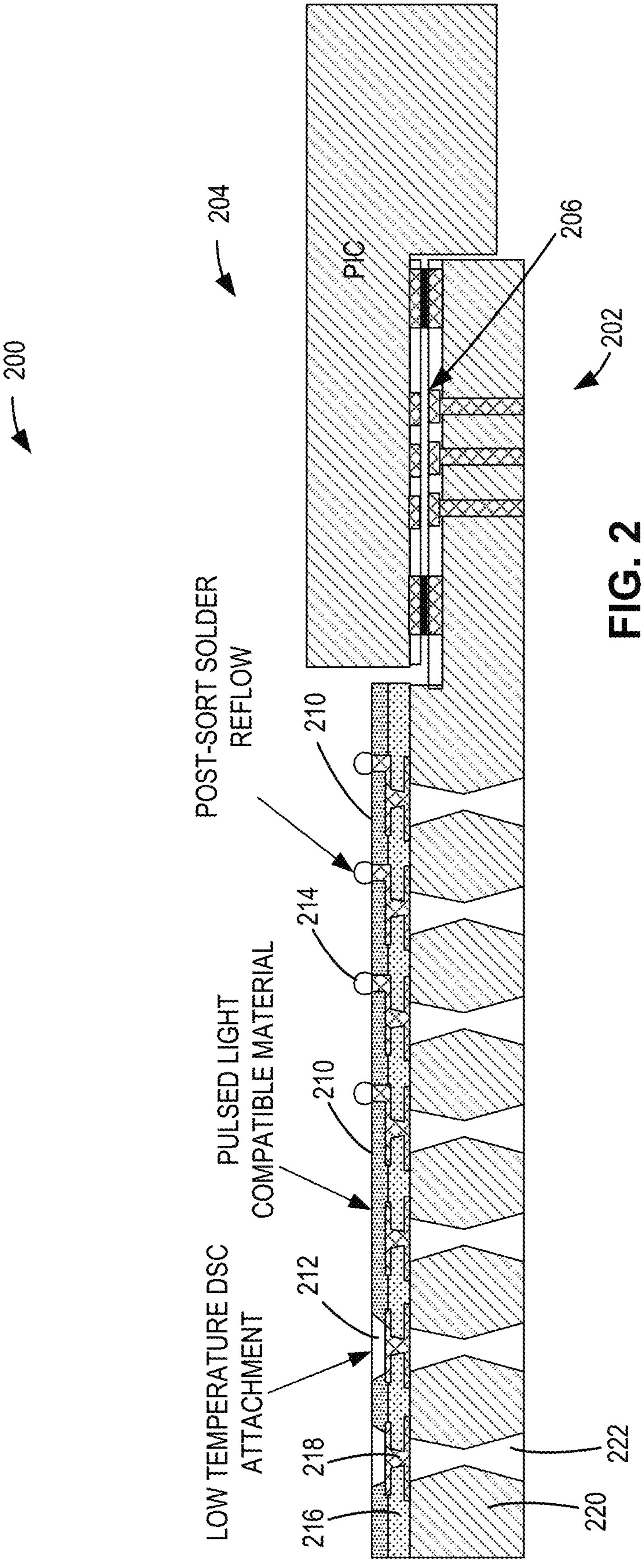
FIG. 2 is a cross-sectional view of an example structure in accordance with teachings of this disclosure.

FIG. 2 is a cross-sectional view of an example structure 200 in accordance with teachings of this disclosure. The example structure 200 corresponds to a glass structure (e.g., a glass core structure) having thermally sensitive materials and/or structures that can be susceptible to damage and/or unintended operation when exposed to a temperature above a temperature threshold. In the illustrated example of FIG. 2, a semiconductor package 202 operatively coupled to a photonic integrated circuit (PIC) die 204 at an interface 206, which can be a low temperature interface/connection. In this example, the semiconductor package 202 includes light absorption material 210 with a low temperature attachment 212 and solder reflow posts/bumps 214 defined thereon. Further, the example semiconductor package 202 includes a substrate 216 with routing/interconnects 218, as well as a substrate 220 with routing/interconnects 222.

To cause interconnects, such as the example solder reflow posts/bumps 214, to reflow while reducing heat exposure of other components and/or structures having relatively low temperature thresholds, exposing the light absorption material 210, which is a surface dielectric material that is polyimide based in this example, to pulsed light causes relatively localized heat generation that does not adversely affect the low temperature attachment 212. Accordingly, the low temperature attachment 212 can be coupled without a reflow process. Further, the solder reflow posts/bumps 214 can be soldered or re-attached/re-soldered with the exposure of the light absorption material 210 with the pulsed light.

Figure 3:
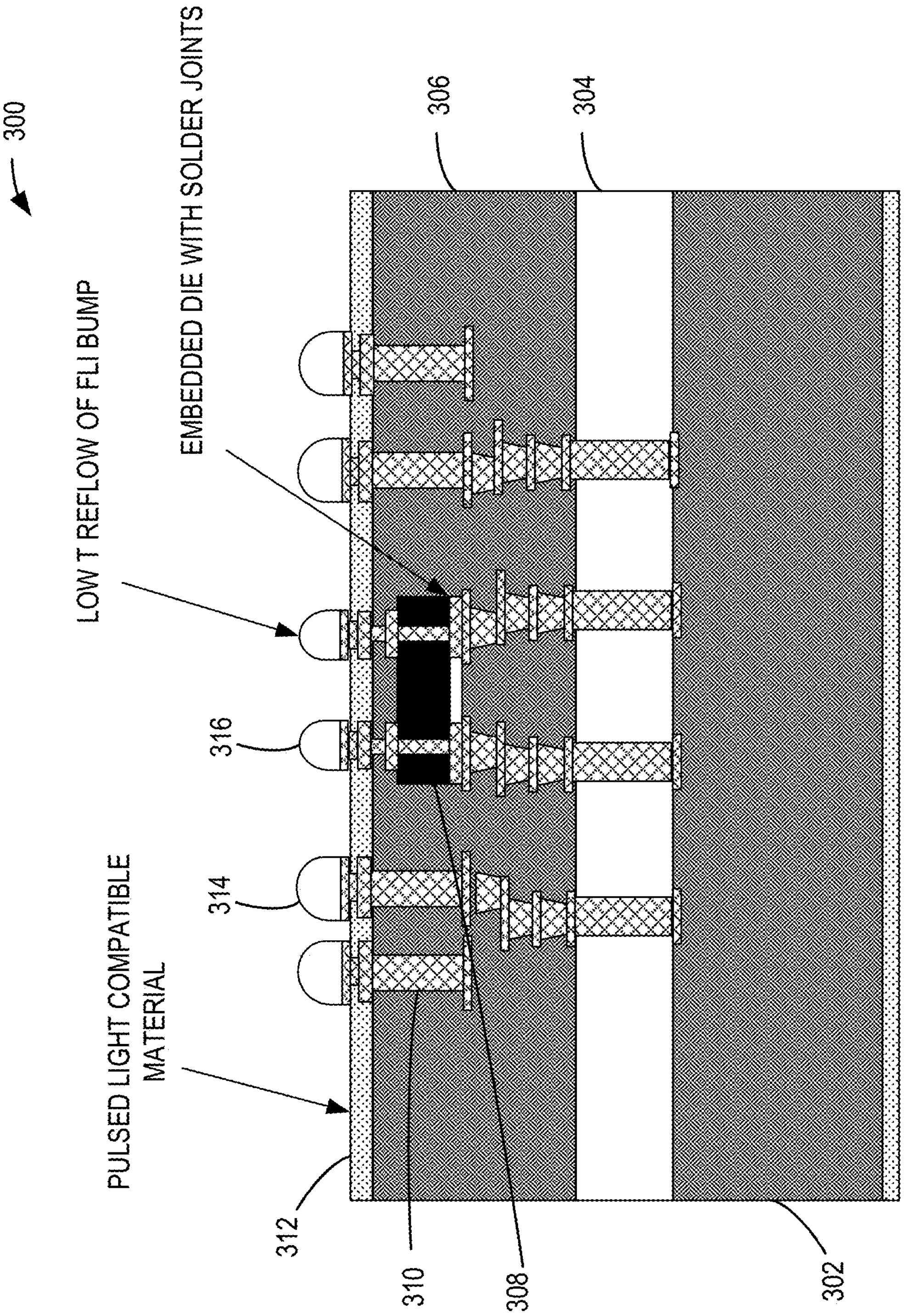
FIG. 3 is a cross-sectional view of another example structure in accordance with teachings of this disclosure.

FIG. 3 is a cross-sectional view of another example structure 300 in accordance with teachings of this disclosure. In this example, the structure 300 includes a substrate 302, a substrate 304, a substrate 306, an embedded die 308, interconnects 310, a light absorption material (e.g., a light absorption layer) 312, interconnect solder bumps 314 and die solder bumps 316.

In this example, the light absorption material 312 is exposed to a pulsed light for reflow of the interconnect solder bumps 314 and/or the die solder bumps 316. In some examples, only a portion and/or portions of the light absorption material 312 are provided with the pulsed light for reflow at different locations of the structure 300. In other words, in some examples, the pulsed light can be directed to specific locations of the light absorption material 312.

Examples can be implemented in die chips and/or packages, such as multi-chip modules (MCMs), for example. Further, examples disclosed herein can be implemented in packages and/or devices (die chips) having multiple die, which can be embedded or otherwise. Further, the example light absorption material 312 of FIG. 3 is depicted as a layer spanning multiple interconnects. However, the light absorption material 312 can be implemented as segments or portions proximate the interconnects.

Figure 4:
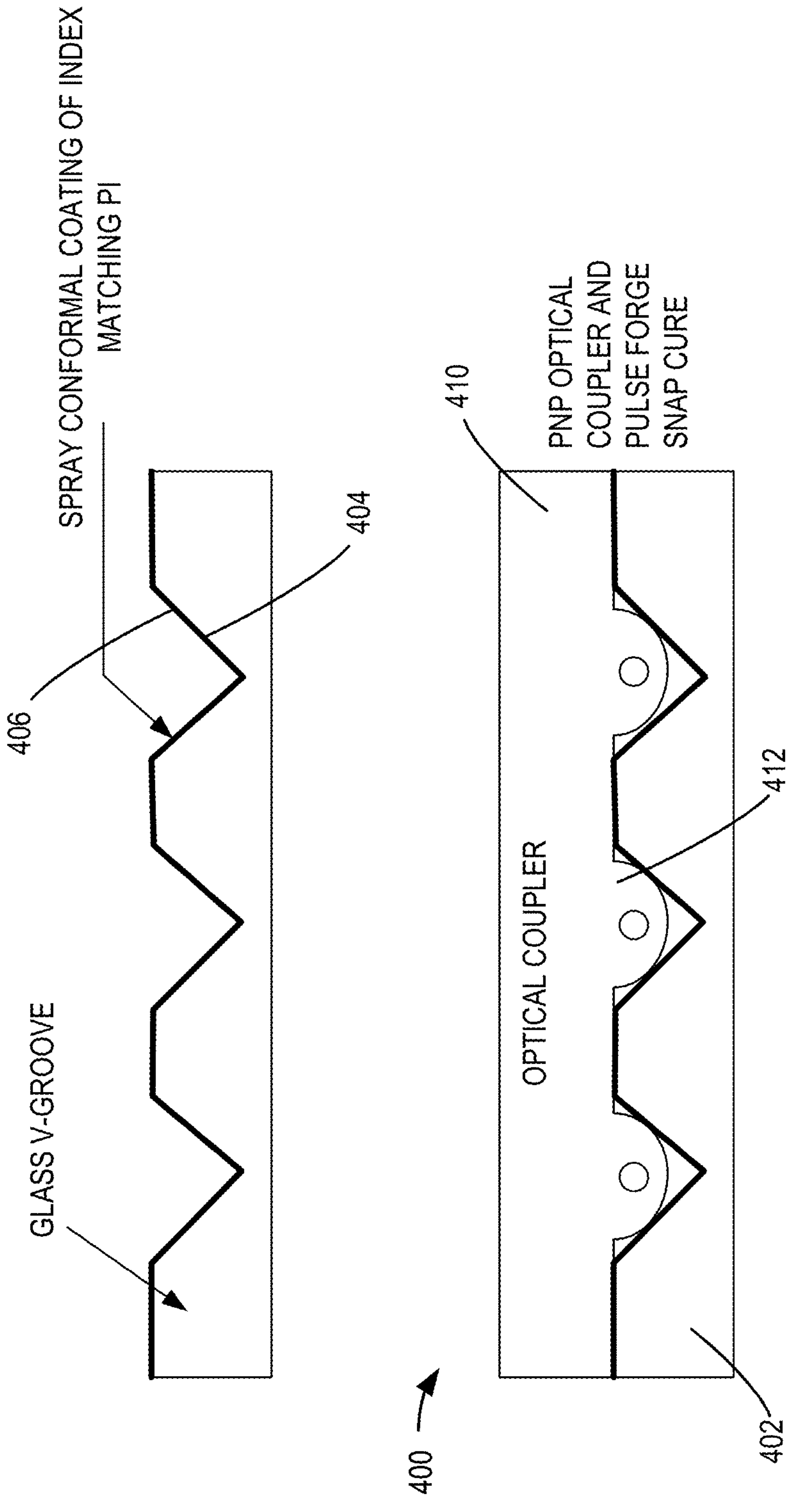
FIG. 4 is a cross-sectional view of yet another example structure in accordance with teachings of this disclosure.

FIG. 4 is a cross-sectional view of yet another example structure 400 in accordance with teachings of this disclosure. In the illustrated example, an optical coupler is depicted. In this example, the structure 400 includes a substrate 402 having grooves 404, which are generally v-shaped in this example to define a saw-tooth interface, with a light absorption material 406 sprayed and/or applied thereon. In particular, the light absorption material 406 is a spray conformal coating of index matching polyimide. However, any other appropriate material can be implemented instead. In turn, a substrate 410 is coupled to the substrate 402 via the aforementioned grooves 404.

To couple and/or secure the aforementioned substrate 410 to the substrate 402, protrusions or tabs 412 of the substrate 410 are inserted into corresponding ones of the grooves 404. In turn, the light absorption material 406 is provided with a pulsed light, thereby causing the substrate 410 to "snap" together. In particular, the substrate 410 and the substrate 402 are cured together by heating the light absorption material 406. In some examples, at least one of the substrate 402 or the substrate 410 is at least partially transparent, thereby enabling optical thermal heating even when the substrate 410 is placed onto the substrate 402.

Figure 5:
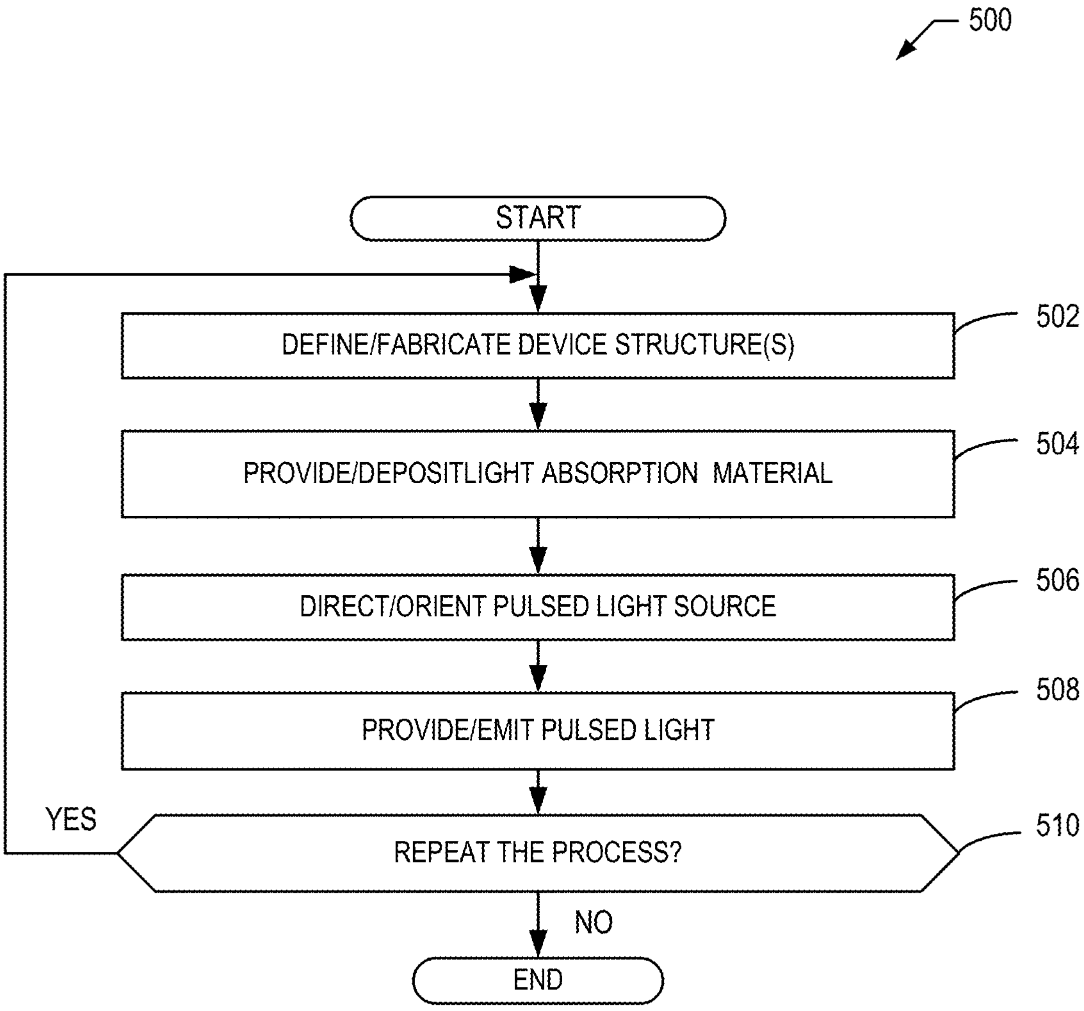
FIG. 5 is a flowchart representative of an example method to produce examples disclosed herein.

FIG. 5 is a flowchart representative of an example method 500 to produce examples disclosed herein. The example method 500 can be utilized for any appropriate thermal process including, but not limited to, solder reflow, curing, bonding, component/device removal, etc. In this example, the method 500 pertains to fabrication of a semiconductor device/package.

At block 502, the semiconductor device/package is defined. In particular, the semiconductor device/package is fabricated to include dielectric substrates (e.g., dielectric substrate layers) with interconnects. The interconnects can be vias, routing, traces, etc.

At block 504, a light absorption material (e.g., the light absorption material 104, the light absorption material 210, the light absorption material 312, the light absorption material 406), which can be thermally and/or optically sensitive, is provided to the semiconductor package. The light absorption material can be applied as a layer, assembled, painted, and/or sprayed, etc. In some examples, the light absorption material is provided proximate or adjacent a material and/or layer that is at least partially transparent. In some examples, the light absorption material is at least partially composed of polyimide.

At block 506, the pulsed light source 102 shown in FIGS. 1A and 1B is directed, aimed and/or oriented toward the light absorption material. For example, the pulsed light source is generally directed toward a center and/or centroid of the light absorption material. In some examples, the pulsed light source 102 is directed to a portion and/or region of the light absorption material (e.g., for curing and/or solder reflow). Additionally or alternatively, the pulsed light source 102 provides pulsed light to multiple portions of the light absorption material (e.g., simultaneously).

At block 508, a pulsed light is provided by and/or transmitted from the example pulsed light source 102 to the aforementioned light absorption material. In this example, the pulsed light is provided at a frequency of approximately 1 to 10 milliseconds (ms) and has a broadband spectrum with visible light. In other words, the pulsed light contains many wavelengths and, thus, can be seen as a white light. The pulsed light can be provided to multiple locations for each exposure (e.g., aimed at multiple portions of the light absorption material 104). In other words, the pulsed light can be aimed at multiple different portions of the light absorption material 104 simultaneously.

At block 510, it is determined whether to repeat the process. If the process is to be repeated (block 510), control of the process returns to block 502. Otherwise, the process ends. This determination may be based on whether additional structures are to be thermal processed.

The example optically thermal processed structures disclosed herein may be included in any suitable electronic component. FIGS. 6-10 illustrate various examples of apparatus that may include or be included in the optically thermal processed structures disclosed herein.

Figure 6:
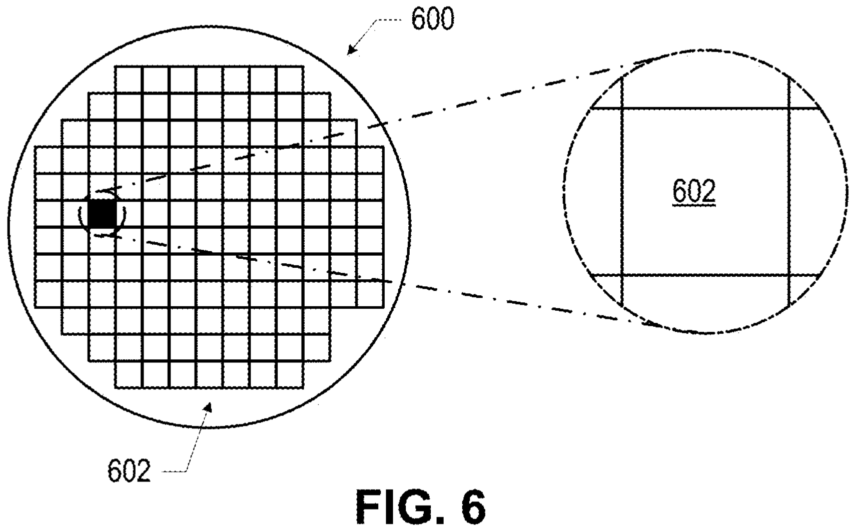
FIG. 6 is a top view of a wafer including dies that may be included in an IC package constructed in accordance with teachings disclosed herein.

FIG. 6 is a top view of a wafer 600 and dies 602 that may be included in an IC package whose substrate includes one or more optically thermal processed structures (e.g., as discussed below with reference to FIG. 8) in accordance with any of the examples disclosed herein. The wafer 600 may be composed of semiconductor material and may include one or more dies 602 having circuitry. Each of the dies 602 may be a repeating unit of a semiconductor product. After the fabrication of the semiconductor product is complete, the wafer 600 may undergo a singulation process in which the dies 602 are separated from one another to provide discrete "chips." The die 602 may include one or more transistors (e.g., some of the transistors 740 of FIG. 7, discussed below), supporting circuitry to route electrical signals to the transistors, passive components (e.g., traces, resistors, capacitors, inductors, and/or other circuitry), and/or any other components. In some examples, the die 602 may include and/or implement a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuitry. Multiple ones of these devices may be combined on a single die 602. For example, a memory array formed by multiple memory circuits may be formed on a same die 602 as programmable circuitry (e.g., the processor circuitry 1002 of FIG. 10) or other logic circuitry. Such memory may store information or instructions for use by the programmable circuitry. The example optically thermal processed structures disclosed herein may be manufactured using a die-to-wafer assembly technique in which some dies are attached to a wafer 600 that include others of the dies, and the wafer 600 is subsequently singulated.

Figure 7:
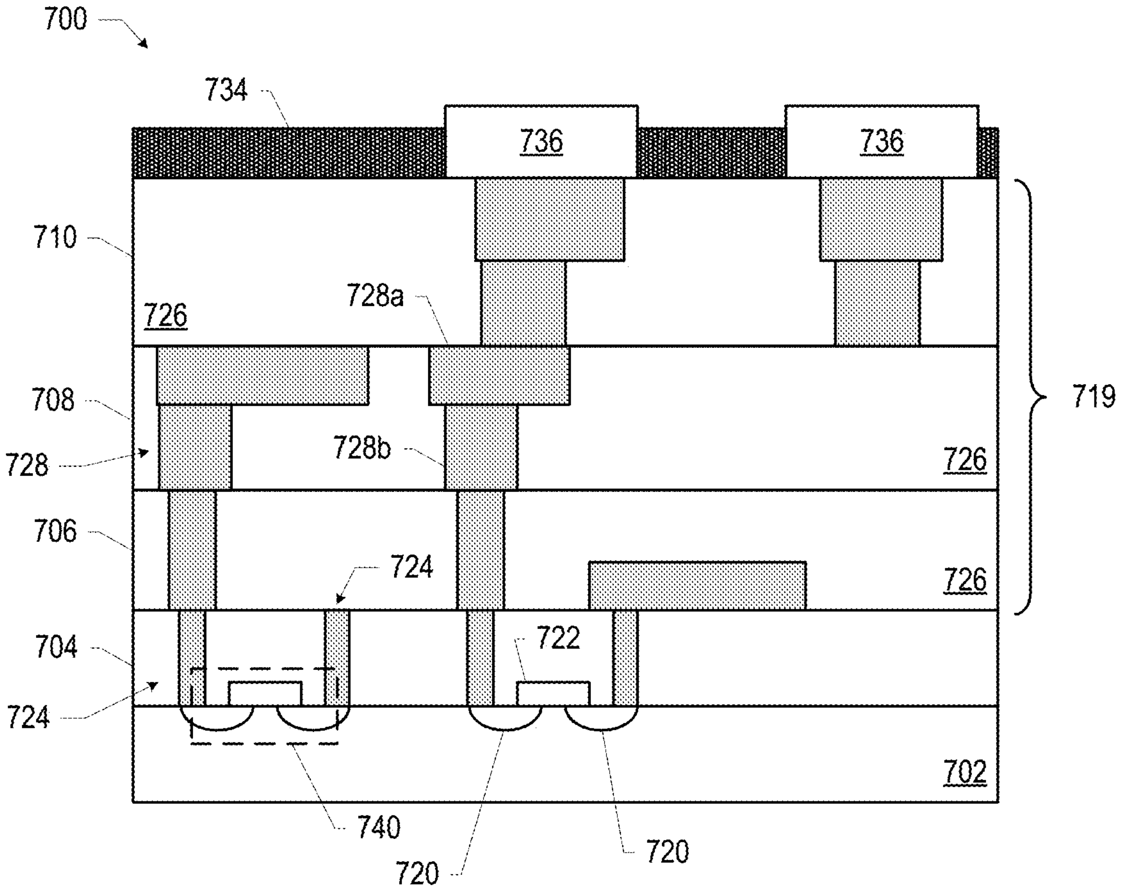
FIG. 7 is a cross-sectional side view of an IC device that may be included in an IC package constructed in accordance with teachings disclosed herein.

FIG. 7 is a cross-sectional side view of an IC device 700 that may be included in an IC package whose substrate includes one or more optically thermal processed structures (e.g., as discussed below with reference to FIG. 8), in accordance with any of the examples disclosed herein. One or more of the IC devices 700 may be included in one or more dies 602 (FIG. 13). The IC device 700 may be formed on a die substrate 702 (e.g., the wafer 600 of FIG. 6) and may be included in a die (e.g., the die 602 of FIG. 6). The die substrate 702 may be a semiconductor substrate composed of semiconductor material systems including, for example, n-type or p-type materials systems (or a combination of both). The die substrate 702 may include, for example, a crystalline substrate formed using a bulk silicon or a silicon-on-insulator (SOI) substructure. In some examples, the die substrate 702 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 702. Although a few examples of materials from which the die substrate 702 may be formed are described here, any material that may serve as a foundation for an IC device 700 may be used. The die substrate 702 may be part of a singulated die (e.g., the dies 602 of FIG. 6) or a wafer (e.g., the wafer 600 of FIG. 6).

The IC device 700 may include one or more device layers 704 disposed on or above the die substrate 702. The device layer 704 may include features of one or more transistors 740 (e.g., metal oxide semiconductor field-effect transistors (MOSFETs)) formed on the die substrate 702. The device layer 704 may include, for example, one or more source and/or drain (S/D) regions 720, a gate 722 to control current flow between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7 and may include a wide variety of other types and/or configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 740 may include a gate 722 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 740 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 740 along the source-channel-drain direction, the gate electrode may consist of a U-shaped structure that includes a bottom portion substantially parallel to the surface of the die substrate 702 and two sidewall portions that are substantially perpendicular to the top surface of the die substrate 702. In other examples, at least one of the metal layers that form the gate electrode may simply be a planar layer that is substantially parallel to the top surface of the die substrate 702 and does not include sidewall portions substantially perpendicular to the top surface of the die substrate 702. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 720 may be formed within the die substrate 702 adjacent to the gate 722 of each transistor 740. The S/D regions 720 may be formed using an implantation/diffusion process or an etching/deposition process, for example. In the former process, dopants such as boron, aluminum, antimony, phosphorous, or arsenic may be ion-implanted into the die substrate 702 to form the S/D regions 720. An annealing process that activates the dopants and causes them to diffuse farther into the die substrate 702 may follow the ion-implantation process. In the latter process, the die substrate 702 may first be etched to form recesses at the locations of the S/D regions 720. An epitaxial deposition process may then be carried out to fill the recesses with material that is used to fabricate the S/D regions 720. In some implementations, the S/D regions 720 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 720 may be formed using one or more alternate semiconductor materials such as germanium or a group III-V material or alloy. In further examples, one or more layers of metal and/or metal alloys may be used to form the S/D regions 720.

Electrical signals, such as power and/or input/output (I/O) signals, may be routed to and/or from the devices (e.g., transistors 740) of the device layer 704 through one or more interconnect layers disposed on the device layer 704 (illustrated in FIG. 7 as interconnect layers 706-710). For example, electrically conductive features of the device layer 704 (e.g., the gate 722 and the S/D contacts 724) may be electrically coupled with the interconnect structures 728 of the interconnect layers 706-710. The one or more interconnect layers 706-710 may form a metallization stack (also referred to as an "ILD stack") 719 of the IC device 700.

The interconnect structures 728 may be arranged within the interconnect layers 706-710 to route electrical signals according to a wide variety of designs (in particular, the arrangement is not limited to the particular configuration of interconnect structures 728 depicted in FIG. 7). Although a particular number of interconnect layers 706-710 is depicted in FIG. 7, examples of the present disclosure include IC devices having more or fewer interconnect layers than depicted.

In some examples, the interconnect structures 728 may include lines **728*a* and/or vias 728*b* filled with an electrically conductive material such as a metal. The lines 728*a* may be arranged to route electrical signals in a direction of a plane that is substantially parallel with a surface of the die substrate 702 upon which the device layer 704 is formed. For example, the lines 728*a* may route electrical signals in a direction in and out of the page from the perspective of FIG. 7. The vias 728*b* may be arranged to route electrical signals in a direction of a plane that is substantially perpendicular to the surface of the die substrate 702 upon which the device layer 704 is formed. In some examples, the vias 728*b* may electrically couple lines 728*a* of different interconnect layers 706-710** together.

The interconnect layers 706-710 may include a dielectric material 726 disposed between the interconnect structures 728, as shown in FIG. 7. In some examples, the dielectric material 726 disposed between the interconnect structures 728 in different ones of the interconnect layers 706-710 may have different compositions; in other examples, the composition of the dielectric material 726 between different interconnect layers 706-710 may be the same.

A first interconnect layer 706 (referred to as Metal 1 or "M1") may be formed directly on the device layer 704. In some examples, the first interconnect layer 706 may include lines **728*a* and/or vias 728*b*, as shown. The lines 728*a* of the first interconnect layer 706 may be coupled with contacts (e.g., the S/D contacts 724) of the device layer 704**.

A second interconnect layer 708 (referred to as Metal 2 or "M2") may be formed directly on the first interconnect layer 706. In some examples, the second interconnect layer 708 may include vias **728*b* to couple the lines 728*a* of the second interconnect layer 708 with the lines 728*a* of the first interconnect layer 706. Although the lines 728*a* and the vias 728*b* are structurally delineated with a line within each interconnect layer (e.g., within the second interconnect layer 708) for the sake of clarity, the lines 728*a* and the vias 728*b*** may be structurally and/or materially contiguous (e.g., simultaneously filled during a dual-damascene process) in some examples.

A third interconnect layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706. In some examples, the interconnect layers that are "higher up" in the metallization stack 719 in the IC device 700 (i.e., further away from the device layer 704) may be thicker.

The IC device 700 may include a solder resist material 734 (e.g., polyimide or similar material) and one or more conductive contacts 736 formed on the interconnect layers 706-710. In FIG. 7, the conductive contacts 736 are illustrated as taking the form of bond pads. The conductive contacts 736 may be electrically coupled with the interconnect structures 728 and configured to route the electrical signals of the transistor(s) 740 to other external devices. For example, solder bonds may be formed on the one or more conductive contacts 736 to mechanically and/or electrically couple a chip including the IC device 700 with another component (e.g., a circuit board). The IC device 700 may include additional or alternate structures to route the electrical signals from the interconnect layers 706-710; for example, the conductive contacts 736 may include other analogous features (e.g., posts) that route the electrical signals to external components.

Figure 8:
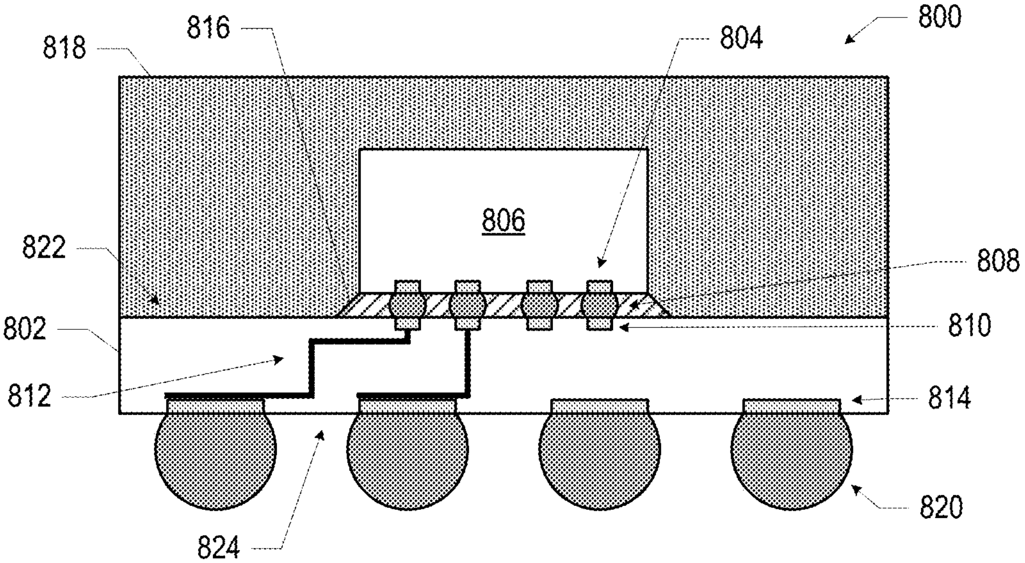
FIG. 8 is a cross-sectional side view of an IC package that may include examples in accordance with teachings disclosed herein.

FIG. 8 is a cross-sectional view of an example IC package 800 that may include one or more optically thermal processed structures. The package substrate 802 may be formed of a dielectric material, and may have conductive pathways extending through the dielectric material between upper and lower faces 822, 824, or between different locations on the upper face 822, and/or between different locations on the lower face 824. These conductive pathways may take the form of any of the interconnects 728 discussed above with reference to FIG. 7. In some examples, any number of optically thermal processed structures (with any suitable structure) may be included in a package substrate 802. In some examples, no optically thermal processed structures may be included in the package substrate 802.

The IC package 800 may include a die 806 coupled to the package substrate 802 via conductive contacts 804 of the die 806, first-level interconnects 808, and conductive contacts 810 of the package substrate 802. The conductive contacts 810 may be coupled to conductive pathways 812 through the package substrate 802, allowing circuitry within the die 806 to electrically couple to various ones of the conductive contacts 814 or to the examples disclosed herein (or to other devices included in the package substrate 802, not shown). The first-level interconnects 808 illustrated in FIG. 8 are solder bumps, but any suitable first-level interconnects 808 may be used. As used herein, a "conductive contact" refers to a portion of conductive material (e.g., metal) serving as an electrical interface between different components. Conductive contacts may be recessed in, flush with, or extending away from a surface of a component, and may take any suitable form (e.g., a conductive pad or socket).

In some examples, an underfill material 816 may be disposed between the die 806 and the package substrate 802 around the first-level interconnects 808, and a mold compound 818 may be disposed around the die 806 and in contact with the package substrate 802. In some examples, the underfill material 816 may be the same as the mold compound 818. Example materials that may be used for the underfill material 816 and the mold compound 818 are epoxy mold materials, as suitable. Second-level interconnects 820 may be coupled to the conductive contacts 814. The second-level interconnects 820 illustrated in FIG. 8 are solder balls (e.g., for a ball grid array arrangement), but any suitable second-level interconnects 820 may be used (e.g., pins in a pin grid array arrangement or lands in a land grid array arrangement). The second-level interconnects 820 may be used to couple the IC package 800 to another component, such as a circuit board (e.g., a motherboard), an interposer, or another IC package, as known in the art and as discussed below with reference to FIG. 9.

In FIG. 8, the IC package 800 is a flip chip package, and includes an optically thermal processed structure in the package substrate 802. The number and location of optically thermal processed structure in the package substrate 802 of the IC package 800 is simply illustrative, and any number of optically thermal processed structure (with any suitable structure) may be included in a package substrate 802. In some examples, no optically thermal processed structure may be included in the package substrate 802. The die 806 may take the form of any of the examples of the processor circuitry 1002 discussed herein (e.g., may include any of the examples of the IC device 700). In some examples, the die 806 may include one or more examples disclosed herein (e.g., as discussed above with reference to FIG. 6 and FIG. 7); in other examples, the die 806 may not include any of the examples disclosed herein.

Although the IC package 800 illustrated in FIG. 8 is a flip chip package, other package architectures may be used. For example, the IC package 800 may be a ball grid array (BGA) package, such as an embedded wafer-level ball grid array (eWLB) package. In another example, the IC package 800 may be a wafer-level chip scale package (WLCSP) or a panel fanout (FO) package. Although a single die 806 is illustrated in the IC package 800 of FIG. 8, an IC package 800 may include multiple dies 806 (e.g., with one or more of the multiple dies 806 coupled to examples disclosed herein included in the package substrate 802). An IC package 800 may include additional passive components, such as surface-mount resistors, capacitors, and inductors disposed on the first face 822 or the second face 824 of the package substrate 802. More generally, an IC package 800 may include any other active or passive components known in the art.

Figure 9:
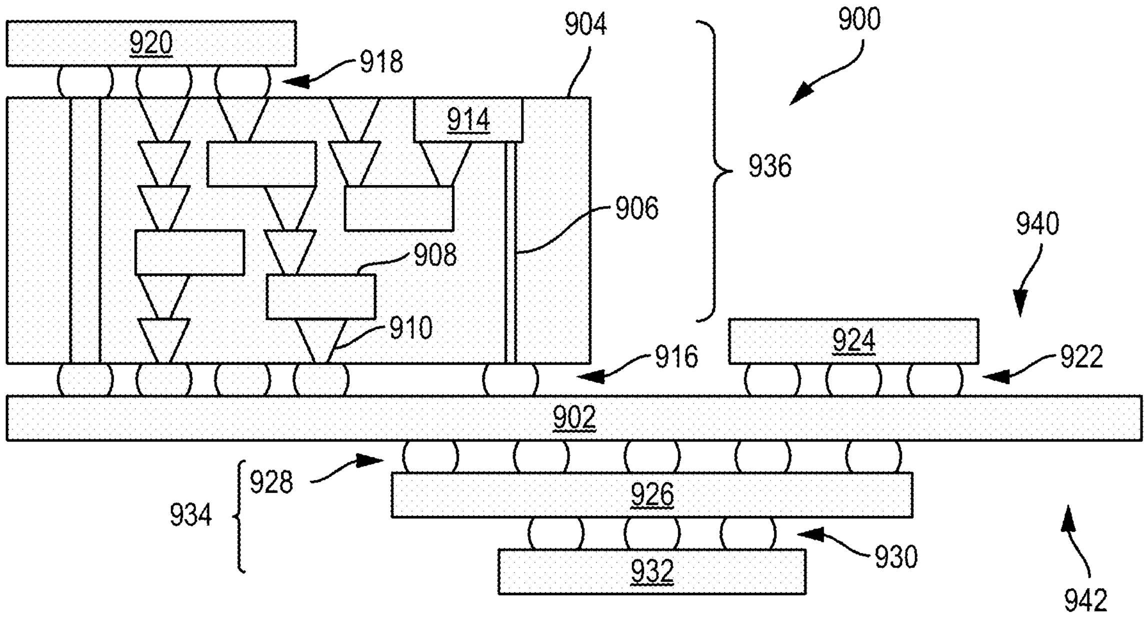
FIG. 9 is a cross-sectional side view of an IC device assembly that may include an IC package constructed in accordance with teachings disclosed herein.

FIG. 9 is a cross-sectional side view of an IC device assembly 900 that may include the examples disclosed herein. In some examples, the IC device assembly corresponds to the examples disclosed herein. The IC device assembly 900 includes a number of components disposed on a circuit board 902 (which may be, for example, a motherboard). The IC device assembly 900 includes components disposed on a first face 940 of the circuit board 902 and an opposing second face 942 of the circuit board 902; generally, components may be disposed on one or both faces 940 and 942.

In some examples, the circuit board 902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 902. In other examples, the circuit board 902 may be a non-PCB substrate.

The IC device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), male and female portions of a socket, an adhesive, an underfill material, and/or any other suitable electrical and/or mechanical coupling structure.

The package-on-interposer structure 936 may include an IC package 920 coupled to an interposer 904 by coupling components 918. The coupling components 918 may take any suitable form for the application, such as the forms discussed above with reference to the coupling components 916. Although a single IC package 920 is shown in FIG. 9, multiple IC packages may be coupled to the interposer 904; indeed, additional interposers may be coupled to the interposer 904. The interposer 904 may provide an intervening substrate used to bridge the circuit board 902 and the IC package 920. The IC package 920 may be or include, for example, a die (the die 602 of FIG. 6), an IC device (e.g., the IC device 700 of FIG. 7), or any other suitable component. Generally, the interposer 904 may spread a connection to a wider pitch or reroute a connection to a different connection. For example, the interposer 904 may couple the IC package 920 (e.g., a die) to a set of BGA conductive contacts of the coupling components 916 for coupling to the circuit board 902. In the example illustrated in FIG. 9, the IC package 920 and the circuit board 902 are attached to opposing sides of the interposer 904; in other examples, the IC package 920 and the circuit board 902 may be attached to a same side of the interposer 904. In some examples, three or more components may be interconnected by way of the interposer 904.

In some examples, the interposer 904 may be formed as a PCB, including multiple metal layers separated from one another by layers of dielectric material and interconnected by electrically conductive vias. In some examples, the interposer 904 may be formed of an epoxy resin, a fiberglass-reinforced epoxy resin, an epoxy resin with inorganic fillers, a ceramic material, or a polymer material such as polyimide. In some examples, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through-silicon vias (TSVs) 906. The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art.

The IC device assembly 900 may include an IC package 924 coupled to the first face 940 of the circuit board 902 by coupling components 922. The coupling components 922 may take the form of any of the examples discussed above with reference to the coupling components 916, and the IC package 924 may take the form of any of the examples discussed above with reference to the IC package 920.

The IC device assembly 900 illustrated in FIG. 9 includes a package-on-package structure 934 coupled to the second face 942 of the circuit board 902 by coupling components 928. The package-on-package structure 934 may include a first IC package 926 and a second IC package 932 coupled together by coupling components 930 such that the first IC package 926 is disposed between the circuit board 902 and the second IC package 932. The coupling components 928, 930 may take the form of any of the examples of the coupling components 916 discussed above, and the IC packages 926, 932 may take the form of any of the examples of the IC package 920 discussed above. The package-on-package structure 934 may be configured in accordance with any of the package-on-package structures known in the art.

Figure 10:
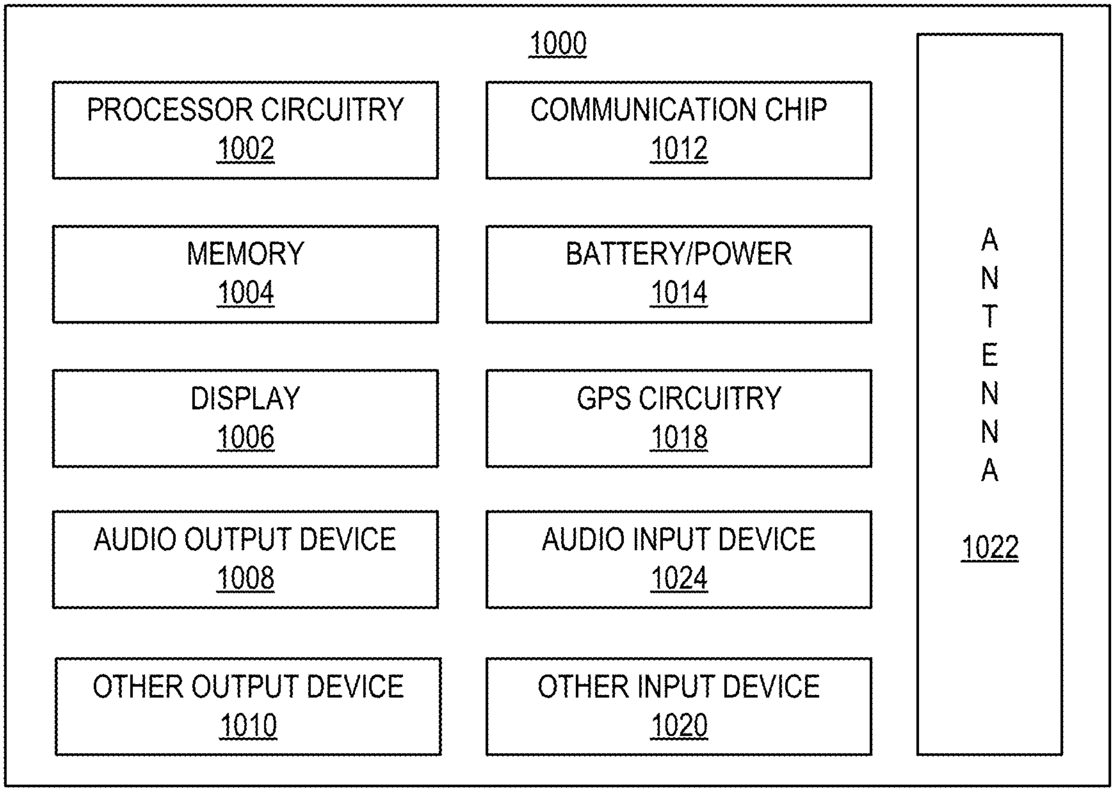
FIG. 10 is a block diagram of an example electrical device that may include an IC package constructed in accordance with teachings disclosed herein.

FIG. 10 is a block diagram of an example electrical device 1000 that may include one or more of the examples disclosed herein. For example, any suitable ones of the components of the electrical device 1000 may include one or more of the device assemblies 900, IC devices 700, or dies 602 disclosed herein, and may be arranged in the examples disclosed herein. A number of components are illustrated in FIG. 10 as included in the electrical device 1000, but any one or more of these components may be omitted or duplicated, as suitable for the application. In some examples, some or all of the components included in the electrical device 1000 may be attached to one or more motherboards. In some examples, some or all of these components are fabricated onto a single system-on-a-chip (SoC) die.

Additionally, in various examples, the electrical device 1000 may not include one or more of the components illustrated in FIG. 10, but the electrical device 1000 may include interface circuitry for coupling to the one or more components. For example, the electrical device 1000 may not include a display 1006, but may include display interface circuitry (e.g., a connector and driver circuitry) to which a display 1006 may be coupled. In another set of examples, the electrical device 1000 may not include an audio input device 1024 (e.g., microphone) or an audio output device 1008 (e.g., a speaker, a headset, earbuds, etc.), but may include audio input or output device interface circuitry (e.g., connectors and supporting circuitry) to which an audio input device 1024 or audio output device 1008 may be coupled.

The electrical device 1000 may include programmable circuitry 1002 (e.g., one or more processing devices). The programmable circuitry 1002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1000 may include a memory 1004, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1004 may include memory that shares a die with the programmable circuitry 1002. This memory may be used as cache memory and may include embedded dynamic random access memory (eDRAM) or spin transfer torque magnetic random access memory (STT-MRAM).

In some examples, the electrical device 1000 may include a communication chip 1012 (e.g., one or more communication chips). For example, the communication chip 1012 may be configured for managing wireless communications for the transfer of data to and from the electrical device 1000. The term “wireless” and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1012 may operate in accordance with other wireless protocols in other examples. The electrical device 1000 may include an antenna 1022 to facilitate wireless communications and/or to receive other wireless communications (such as AM or FM radio transmissions).

In some examples, the communication chip 1012 may manage wired communications, such as electrical, optical, or any other suitable communication protocols (e.g., the Ethernet). As noted above, the communication chip 1012 may include multiple communication chips. For instance, a first communication chip 1012 may be dedicated to shorter-range wireless communications such as Wi-Fi or Bluetooth, and a second communication chip 1012 may be dedicated to longer-range wireless communications such as global positioning system (GPS), EDGE, GPRS, CDMA, WiMAX, LTE, EV-DO, or others. In some examples, a first communication chip 1012 may be dedicated to wireless communications, and a second communication chip 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display 1006 (or corresponding interface circuitry, as discussed above). The display 1006 may include any visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any device that generates an audible indicator, such as speakers, headsets, or earbuds.

The electrical device 1000 may include an audio input device 1024 (or corresponding interface circuitry, as discussed above). The audio input device 1024 may include any device that generates a signal representative of a sound, such as microphones, microphone arrays, or digital instruments (e.g., instruments having a musical instrument digital interface (MIDI) output).

The electrical device 1000 may include a GPS circuitry 1018. The GPS circuitry 1018 may be in communication with a satellite-based system and may receive a location of the electrical device 1000, as known in the art.

The electrical device 1000 may include any other output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include any other input device 1020 (or corresponding interface circuitry, as discussed above). Examples of the other input device 1020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1000 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1000 may be any other electronic device that processes data.

Example methods, apparatus, systems, and articles of manufacture to enable optical thermal processing are disclosed herein. Further examples and combinations thereof include the following:

Example 1 includes an integrated circuit (IC) package comprising a dielectric substrate, an interconnect associated with the dielectric substrate, and light absorption material proximate or surrounding the interconnect, the light absorption material to increase in temperature in response to being exposed to a pulsed light for thermal treatment corresponding to the IC package.

Example 2 includes the IC package as defined in example 1, wherein the exposure of the light absorption material to the pulsed light is to at least partially reflow the interconnect.

Example 3 includes the IC package as defined in any of examples 1 or 2, wherein the dielectric substrate includes or is adjacent a layer having the light absorption material.

Example 4 includes the IC package as defined in example 3, wherein the light absorption material is a layer on or within the dielectric.

Example 5 includes the IC package as defined in example 4, wherein the layer extends across multiple interconnects and the thermal treatment corresponds to reflow of the interconnects.

Example 6 includes the IC package as defined in any of examples 1 to 5, further including a die embedded in the dielectric substrate.

Example 7 includes the IC package as defined in any of examples 1 to 6, wherein the dielectric substrate includes or defines an optical coupler mounting.

Example 8 includes the IC package as defined in any of examples 1 to 7, wherein the dielectric substrate is a first dielectric substrate and the light absorption material is positioned between the first dielectric substrate and a second dielectric substrate.

Example 9 includes the IC package as defined in example 8, wherein the light absorption material is positioned at a sawtooth interface between the first and second dielectrics.

Example 10 includes a die chip comprising a die, a dielectric, an interconnect extending through at least a portion of the dielectric, the interconnect electrically coupled to the die, and a light absorption layer, the light absorption layer having a light absorption material to increase in temperature in response to being exposed to a pulsed light for at least one of reflow of the interconnect or curing corresponding to the die chip.

Example 11 includes the die chip as defined in example 10, wherein the die is a first die, and further including a second die.

Example 12 includes the die chip as defined in any of examples 10 or 11, wherein the light absorption layer is positioned at or proximate a solder bump for reflow thereof.

Example 13 includes the die chip as defined in any of examples 10 to 12, wherein the die is an embedded die.

Example 14 includes the die chip as defined in any of examples 10 to 13, wherein the curing corresponds to curing the dielectric.

Example 15 includes a method of thermal processing for a semiconductor package, the method comprising, providing a dielectric with a light absorption material to the semiconductor package, and applying a pulsed light to the light absorption material to increase a temperature of the light absorption material by at least 100° C. in less than one second.

Example 16 includes the method as defined in example 15, further including defining an interconnect having a reflowable solder joint proximate or adjacent the light absorption material.

Example 17 includes the method as defined in example 16, wherein the applying the pulsed light to the light absorption material causes the reflowable solder joint to melt.

Example 18 includes the method as defined in any of examples 16 or 17, wherein the applying the pulsed light to the light absorption material is to cause a component proximate the light absorption material to cure.

Example 19 includes the method as defined in any of examples 15 to 18, wherein the dielectric is a first dielectric and the light absorption material is positioned between the first dielectric and a second dielectric.

Example 20 includes the method as defined in example 19, wherein the light absorption material is provided at a sawtooth interface between the first and second dielectrics.

From the foregoing, it will be appreciated that example systems, methods, apparatus, and articles of manufacture have been disclosed that enable thermal treatment of semiconductor devices at relatively low temperatures. Accordingly, examples disclosed herein can enable semiconductor packages and/or devices with increased reliability and/or operational life by reducing temperatures of thermal processing utilized therewith.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An integrated circuit (IC) package comprising:

a dielectric substrate;

an interconnect associated with the dielectric substrate; and an electrically non-conductive light absorption polymer proximate or surrounding the interconnect, the light absorption polymer to increase in temperature in response to being exposed to a pulsed light for thermal treatment corresponding to the IC package.

2. The IC package as defined in claim 1, wherein the exposure of the light absorption polymer to the pulsed light is to at least partially reflow the interconnect.

3. The IC package as defined in claim 1, wherein the dielectric substrate includes or is adjacent a layer having the light absorption polymer.

4. The IC package as defined in claim 3, wherein the light absorption polymer is a layer on or within the dielectric substrate.

5. The IC package as defined in claim 4, wherein the layer extends across multiple interconnects and the thermal treatment corresponds to reflow of the interconnects.

6. The IC package as defined in claim 1, including a die embedded in the dielectric substrate.

7. The IC package as defined in claim 1, wherein the dielectric substrate includes or defines an optical coupler mounting.

8. The IC package as defined in claim 1, wherein the dielectric substrate is a first dielectric substrate and the light absorption polymer is between the first dielectric substrate and a second dielectric substrate.

9. The IC package as defined in claim 1, wherein the light absorption polymer includes polyimide.

10. The IC package as defined in claim 1, wherein the interconnect is a first interconnect, and the IC package includes a second interconnect associated with the dielectric substrate, the light absorption polymer extending continuously from the first interconnect to the second interconnect while maintaining the first interconnect in electrical isolation relative to the second interconnect.

11. The IC package as defined in claim 1, wherein the interconnect is a first interconnect, and the IC package includes a second interconnect associated with the dielectric substrate, the light absorption polymer extending continuously from the first interconnect to the second interconnect, the first interconnect including solder, the second interconnect having a temperature threshold below a melting point of the solder.

12. The IC package as defined in claim 1, wherein the light absorption polymer is to increase in temperature by at least 100° Celsius in less than one second.

13. The IC package as defined in claim 1, wherein the light absorption polymer is to increase in temperature up to at least 300° Celsius in less than 10 seconds.

14. An integrated circuit (IC) package comprising:

a first dielectric substrate;

a second dielectric substrate; and a light absorption material at a sawtooth interface between the first and second dielectric substrates, the light absorption material to increase in temperature in response to being exposed to a pulsed light for thermal treatment corresponding to the IC package.

15. An apparatus comprising:

a die;

a dielectric;

multiple interconnects extending through at least a portion of the dielectric, the interconnects electrically coupled to the die; and a light absorption layer, the light absorption layer having a light absorption material to increase in temperature in response to being exposed to a pulsed light for at least one of reflow of the at least one of the interconnects or curing corresponding to the apparatus, the light absorption layer in contact with and extending continuously between different ones of the interconnects while maintaining electrical isolation between the different ones of the interconnects.

16. The apparatus as defined in claim 15, wherein the die is a first die, the apparatus including a second die.

17. The apparatus as defined in claim 15, wherein the light absorption layer is at or proximate a solder bump for reflow thereof.

18. The apparatus as defined in claim 15, wherein the die is an embedded die.

19. The apparatus as defined in claim 15, wherein the curing corresponds to curing the dielectric.

* * * * *